United States Patent
Oh et al.

(10) Patent No.: US 9,806,141 B2
(45) Date of Patent: Oct. 31, 2017

(54) ORGANIC LIGHT EMITTING DISPLAY DEVICE HAVING LIGHT BLOCKING LAYER CONNECTING ADJACENT SUBPIXELS AND METHOD FOR MANUFACTURING THE SAME

(71) Applicant: LG DISPLAY CO., LTD., Seoul (KR)

(72) Inventors: Jaeyoung Oh, Goyang-si (KR); Imkuk Kang, Paju-si (KR); Sangmoo Park, Goyang-si (KR); Jongsoo Han, Paju-si (KR)

(73) Assignee: LG DISPLAY CO., LTD., Seoul (KR)

( * ) Notice: Subject to any disclaimer, the term of this patent is extended or adjusted under 35 U.S.C. 154(b) by 0 days.

(21) Appl. No.: 14/983,240

(22) Filed: Dec. 29, 2015

(65) Prior Publication Data
US 2016/0380039 A1    Dec. 29, 2016

(30) Foreign Application Priority Data
Jun. 26, 2015  (KR) ........................ 10-2015-0091267

(51) Int. Cl.
*H01L 27/32* (2006.01)
(52) U.S. Cl.
CPC ...... *H01L 27/3276* (2013.01); *H01L 27/3211* (2013.01); *H01L 27/3213* (2013.01); *H01L 27/3262* (2013.01); *H01L 27/3272* (2013.01); *H01L 2227/323* (2013.01)

(58) Field of Classification Search
CPC ............. H01L 27/3276; H01L 27/3262; H01L 27/3272; H01L 27/3211; H01L 27/3213
See application file for complete search history.

(56) References Cited

U.S. PATENT DOCUMENTS

| | | | | |
|---|---|---|---|---|
| 2013/0257839 A1* | 10/2013 | Hyeon | ..................... | G06F 3/038 345/212 |
| 2015/0108482 A1* | 4/2015 | Kim | ..................... | H01L 27/3276 257/71 |
| 2015/0379939 A1* | 12/2015 | Takasugi | ................... | G09G 5/18 345/690 |
| 2016/0064411 A1* | 3/2016 | Park | ....................... | H01L 27/124 257/89 |
| 2016/0078809 A1* | 3/2016 | Yoon | ..................... | G09G 3/3233 345/78 |

* cited by examiner

*Primary Examiner* — Michael Jung
(74) *Attorney, Agent, or Firm* — Birch, Stewart, Kolasch & Birch, LLP

(57) ABSTRACT

An organic light emitting display device has a display panel including a first subpixel, a second subpixel, a data line, and sensing lines. The sensing lines may include a vertical sensing line and a horizontal sensing line connected to the vertical sensing line. The horizontal sensing line may be formed of a source/drain metal layer present on the first substrate, and one portion thereof connected to a first electrode of a sensing transistor of the first subpixel and the other portion thereof connected to a first electrode of a sensing transistor of the second subpixel may be positioned in a region intersecting with the data line, and electrically connected by a connection electrode formed of an insulated light blocking layer below the source/drain metal layer present on the first substrate.

15 Claims, 18 Drawing Sheets

ORGANIC LIGHT EMITTING DISPLAY DEVICE HAVING LIGHT BLOCKING LAYER CONNECTING ADJACENT SUBPIXELS AND METHOD FOR MANUFACTURING THE SAME

This application claims the priority benefit under 35 U.S.C. §119(a) of Korean Patent Application No. 10-2015-0091267, filed on Jun. 26, 2015, which is incorporated herein by reference for all purposes as if fully set forth herein.

BACKGROUND OF THE INVENTION

Field of the Disclosure

The present disclosure relates to an organic light emitting display device and a method for manufacturing the same.

Description of the Related Art

As the information technology has advanced, the market of display devices as mediums connecting users and information has grown. In line with this, the use of display devices such as organic light emitting display devices, liquid crystal displays (LCDs), and plasma display panels (PDPs) has increased.

Among the aforementioned display devices, the organic light emitting display device includes a display panel including a plurality of subpixels and a driver driving the display panel. The driver includes a scan driver supplying a scan signal (or a gate signal) to the display panel and a data driver supplying a data signal to the display panel.

In the organic light emitting display device, when a scan signal and a data signal are supplied to the subpixels disposed in a matrix form, selected subpixels emit light to display an image. The organic light emitting display device has a problem in that when it is used for a long period of time, characteristics (threshold voltage, current, and mobility) of elements included in the subpixels are changed. In order to compensate for this, a scheme of adding a circuit for sensing the characteristics of the elements included in the subpixels has been proposed.

In the scheme of adding a sensing circuit, a sensing transistor and a sensing line are added in each of the subpixels. The scheme of adding a sensing circuit relatively increases complexity of a layout design of a display panel. The increase in complexity of the layout design of the display panel leads to an increase in a region in which different kinds of lines (or wirings) overlap each other.

In the conventionally proposed structure, a static electricity short, a by-product, or generation frequency of shorts due to the by-product and static electricity appear to be high in the portion in which different kinds of lines overlap each other. This causes a line defect in a specific line of a display surface of a display panel, resulting in poor image quality. Thus, the scheme of adding a sensing circuit needs to be studied to solve the problem that may arise in the process of manufacturing a display panel.

SUMMARY OF THE INVENTION

An aspect of the present disclosure provides an organic light emitting display device having a display panel including a first subpixel, a second subpixel, a data line, and sensing lines. The first subpixel and the second subpixel are disposed to be spaced apart from one another on a first substrate. The data line is positioned between the first subpixel and the second subpixel and disposed in a vertical direction. The sensing lines may include a vertical sensing line positioned on one side of the second subpixel and disposed in the vertical direction and a horizontal sensing line disposed in a horizontal direction intersecting with the data line and connected to the vertical sensing line. The horizontal sensing line may be formed of a source/drain metal layer present on the first substrate, and one portion thereof connected to a first electrode of a sensing transistor of the first subpixel and the other portion thereof connected to a first electrode of a sensing transistor of the second subpixel may be positioned in a region intersecting with the data line, and electrically connected by a connection electrode formed of an insulated light blocking layer below the source/drain metal layer present on the first substrate.

Another aspect of the present disclosure provides an organic light emitting display device having a display panel including a first subpixel, a second subpixel, a data line, and sensing lines. The first subpixel and the second subpixel are disposed to be spaced apart from one another on a first substrate. The data line is positioned between the first subpixel and the second subpixel and disposed in a vertical direction. The sensing lines may include a vertical sensing line positioned on one side of the second subpixel and disposed in the vertical direction and a horizontal sensing line disposed in a horizontal direction intersecting with the data line and connected to the vertical sensing line. The horizontal sensing line may be formed of a source/drain metal layer present on the first substrate, and one portion thereof connected to a first electrode of a sensing transistor of the first subpixel and the other portion thereof connected to a first electrode of a sensing transistor of the second subpixel may be positioned in a region intersecting with the data line, and electrically connected by a connection electrode formed of an insulated gate metal layer below the source/drain metal layer present on the first substrate.

Another aspect of the present disclosure provides an organic light emitting display device having a display panel including a first subpixel, a second subpixel, a data line, and sensing lines. The first subpixel and the second subpixel are disposed to be spaced apart from one another on a first substrate. The data line is positioned between the first subpixel and the second subpixel and disposed in a vertical direction. The sensing lines may include a vertical sensing line positioned on one side of the second subpixel and disposed in the vertical direction and a horizontal sensing line disposed in a horizontal direction intersecting with the data line and connected to the vertical sensing line. The horizontal sensing line may be formed of a pixel electrode present on the first substrate, and one portion thereof connected to a first electrode of a sensing transistor of the first subpixel and the other portion thereof connected to a first electrode of a sensing transistor of the second subpixel may be positioned in a region intersecting with the data line, and electrically connected by a connection electrode formed of an insulated light blocking layer below the source/drain metal layer present on the first substrate.

Another aspect of the present disclosure provides a method for manufacturing an organic light emitting display device including a display panel having a first subpixel and a second subpixel disposed to be spaced apart from one another on a first substrate, a data line disposed in a vertical direction between the first subpixel and the second subpixel, and sensing lines having a vertical sensing line disposed on one side of the second subpixel in the vertical direction and a horizontal sensing line disposed in a horizontal direction intersecting with the data line. The method for manufacturing an organic light emitting display device includes: forming a light blocking layer, a buffer layer, a semiconductor layer, and photoresist on the first substrate; patterning the light blocking layer, the buffer layer, and the semiconductor layer using the photoresist to form a portion of the light blocking layer, as a connection electrode, and leave a portion of the semiconductor layer on the connection electrode to form a dummy semiconductor layer; removing the photoresist and forming an interlayer insulating layer covering the light blocking layer, the connection electrode, the buffer layer, the semiconductor layer, and the dummy semiconductor layer on the first substrate; forming a first contact hole in the interlayer insulating layer such that one side of the light blocking layer is exposed, and forming a second contact hole in the interlayer insulating layer such that the other side of the light blocking layer is exposed; and forming a source/drain metal layer on the interlayer insulating layer such that one portion of the source/drain metal layer is in contact with one side of the light blocking layer and the other portion of the source/drain metal layer is in contact with the other side of the light blocking layer to electrically connect the vertical sensing line and the horizontal sensing line.

BRIEF DESCRIPTION OF THE DRAWINGS

The accompany drawings, which are included to provide a further understanding of the invention and are incorporated on and constitute a part of this specification illustrate embodiments of the invention and together with the description serve to explain the principles of the invention.

DETAILED DESCRIPTION OF THE EMBODIMENTS

Reference will now be made in detail embodiments of the disclosure examples of which are illustrated in the accompanying drawings.

Hereinafter, specific embodiments of the present disclosure will be described in detail with reference to the accompanying drawings.

Figure 1:
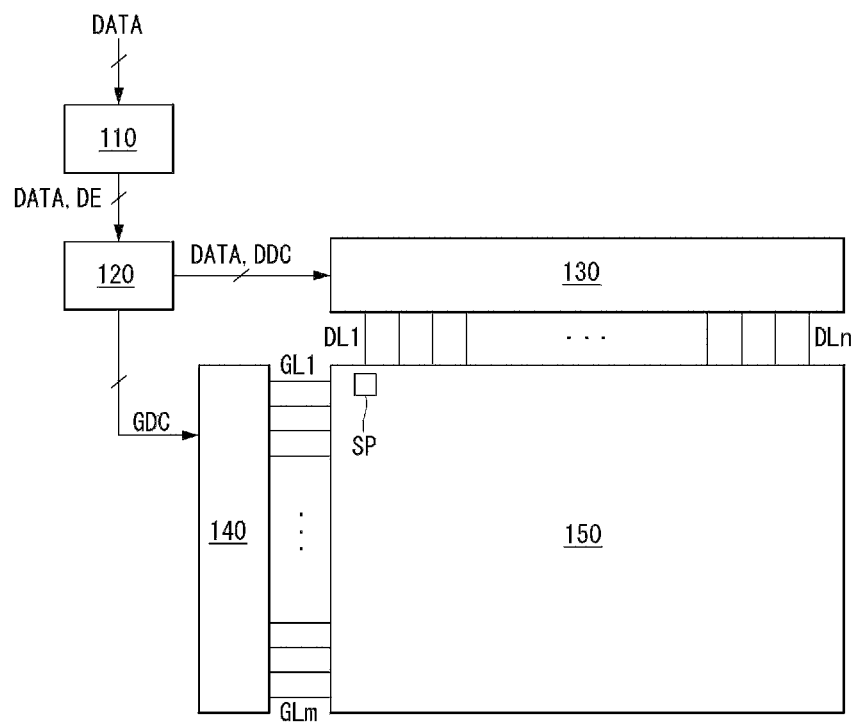
FIG. 1 is a block diagram of an organic light emitting display device according to a first embodiment of the present disclosure.
Figure 2:
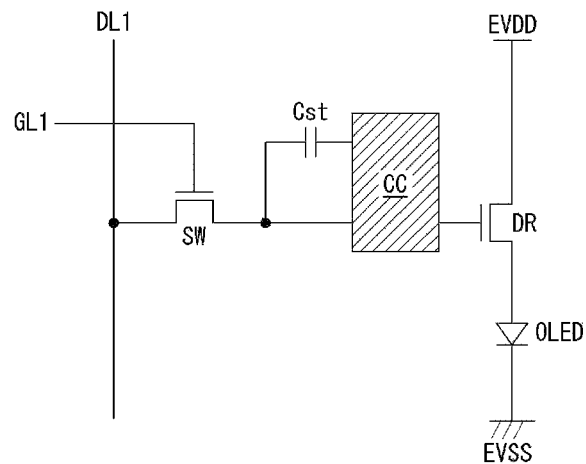
FIG. 2 is a circuit diagram of a subpixel.
Figure 3:
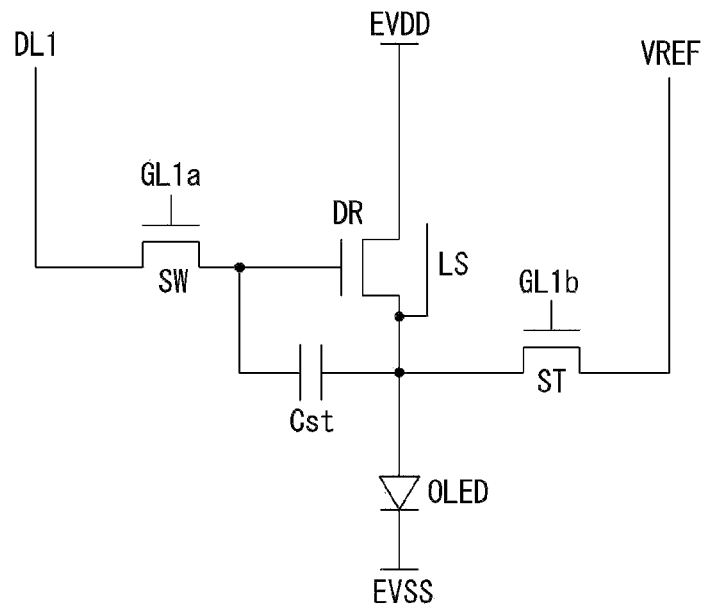
FIG. 3 is a circuit diagram of the conventionally proposed subpixel.
Figure 4:
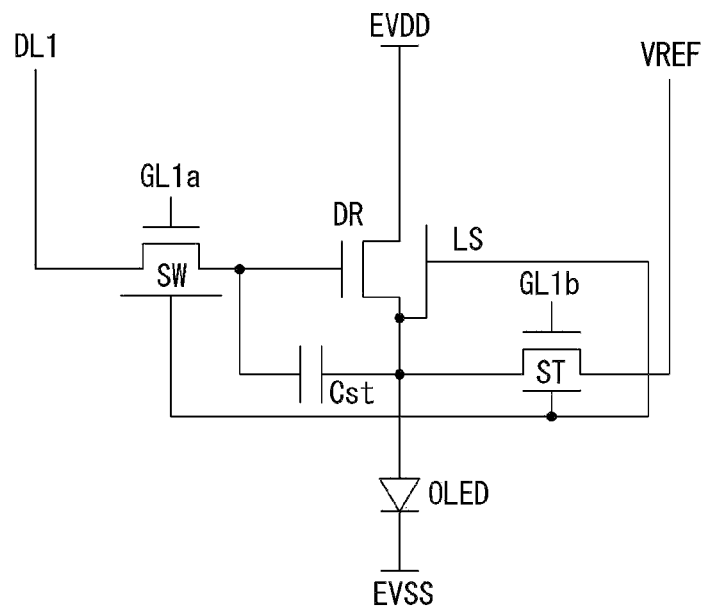
FIG. 4 is a circuit diagram of a subpixel according to the first embodiment of the present disclosure.
Figure 5:
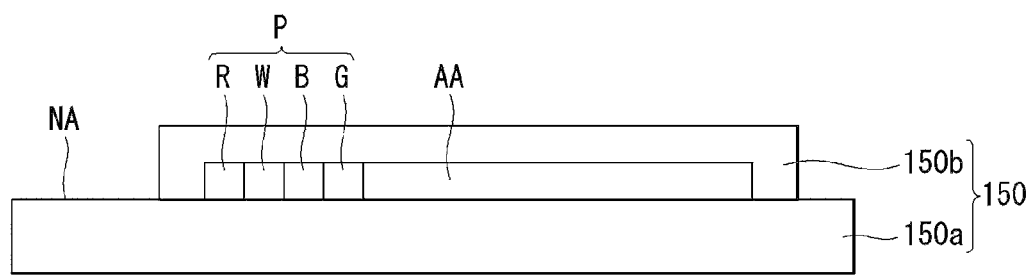
FIG. 5 is a cross-sectional view of a display panel according to the first embodiment of the present disclosure.

FIG. 1 is a block diagram of an organic light emitting display device according to a first embodiment of the present disclosure, FIG. 2 is a circuit diagram of a subpixel, FIG. 3 is a circuit diagram of the conventionally proposed subpixel, FIG. 4 is a circuit diagram of a subpixel according to the first embodiment of the present disclosure, and FIG. 5 is a cross-sectional view of a display panel according to the first embodiment of the present disclosure.

As illustrated in FIG. 1, an organic light emitting display device according to a first embodiment of the present disclosure includes an image processing unit 110, a timing controller 120, a data driver 130, a scan driver 140, and a display panel 150.

The image processing unit 110 outputs a data enable signal DE together with a data signal DATA supplied from the outside. In addition to the data enable signal DE, the image processing unit 110 may output one or more of a vertical synchronization signal, a horizontal synchronization signal, and a clock signal, and here, descriptions of these signal will be omitted for the convenience of description.

The timing controller 120 receives the data enable signal DE or a driving signal including a vertical synchronization signal, a horizontal synchronization signal, and a clock signal, and the data signal DATA. The timing controller 120 outputs a gate timing control signal GDC for controlling an operation timing of the scan driver 140 and a data timing control signal DDC for controlling an operation timing of the data driver 130 on the basis of the driving signal.

In response to the data timing control signal DDC supplied from the timing controller 120, the data driver 130 samples and latches the data signal DATA supplied from the timing controller 120, and converts the latched signal into a gamma reference voltage, and outputs the same. The data driver 130 outputs the data signal DATA through data lines DL1 to DLn. The data driver 130 may be provided in the form of an integrated circuit (IC).

In response to the gate timing control signal GDC supplied from the timing controller 120, the scan driver 140 outputs a scan signal, while shifting a level of a gate voltage. The scan driver 140 outputs a scan signal through scan lines GL1 to GLm. The scan driver 140 may be formed in the form of an integrated circuit (IC) or in a gate-in-panel manner on the display panel 150.

In response to the data signal DATA and the scan signal respectively supplied from the data driver 130 and the scan driver 140, the display panel 150 displays an image. The display panel 150 includes subpixels SP operating to display an image.

The subpixels are formed according to a top-emission scheme, a bottom-emission scheme, or a dual-emission scheme. The subpixels SP include a red subpixel, a green subpixel, and a blue subpixel, or include a white subpixel, a red subpixel, a green subpixel, and a blue subpixel. The subpixels SP may have one or more different emission areas according to emission characteristics.

As illustrated in FIG. 2, one subpixel includes a switching transistor SW, a driving transistor DR, a capacitor Cst, a compensation circuit CC, and an organic light emitting diode OLED.

The switching transistor SW performs a switching operation such that a data signal supplied through the first data line DL1 in response to a scan signal supplied through the first scan line GL1 is stored as a data voltage in the capacitor Cst. The driving transistor DR operates such that a driving current flows between a first power line EVDD and a second power line EVSS according to the data voltage stored in the capacitor Cst. The OLED emits light according to the driving current formed by the driving transistor TR.

The compensation circuit CC is a circuit added to the interior of the subpixel to compensate for a threshold voltage of the driving transistor DR. The compensation circuit CC includes one or more transistors. The compensation circuit CC may be variously configured according to compensation methods, and details thereof will be described as follows.

As illustrated in FIGS. 3 and 4, the compensation circuit CC includes a sensing transistor ST and a sensing line VREF. The sensing transistor ST is connected between a source line of the driving transistor DR and an anode electrode (or a sensing node) of the OLED. The sensing transistor ST operates to supply an initialization voltage (or a sensing voltage) transferred through the sensing line VREF to the sensing node or senses a voltage or a current of the sensing node.

A first electrode of the switching transistor SW is connected to the first data line DL, and a second electrode thereof is connected to a gate electrode of the driving transistor DR. A first electrode of the driving transistor DR is connected to the first power line EVDD and a second electrode thereof is connected to the anode electrode of the OLED. A first electrode of the capacitor Cst is connected to the gate electrode of the driving transistor DR, and a second electrode thereof is connected to the anode electrode of the OLED. The anode electrode of the OLED is connected to the second electrode of the driving transistor DR, and a cathode electrode thereof is connected to the second power line EVSS. A first electrode of the sensing transistor ST is connected to the sensing line VREF and a second electrode thereof is connected to the anode electrode, the sensing node, of the OLED.

An operation time of the sensing transistor ST may be similar to, the same as, or different from that of the switching transistor SW according to a compensation algorithm (or a configuration of the compensation circuit). For example, a gate electrode of the switching transistor SW may be connected to a 1a scan line GL1a, and a gate electrode of the sensing transistor ST may be connected to a 1b scan line GL1b. In another example, the 1a scan line connected to the gate electrode of the switching transistor SW and the 1b scan line GL1b connected to the gate electrode of the sensing transistor ST may be connected to be commonly shared.

The sensing line VREF may be connected to a data driver. In this case, the data driver may sense the sensing node of the subpixel during a non-display period or an N frame (N is an integer equal to or greater than 1) of an image and generate a sensing result in real time. Meanwhile, even though the switching transistor SW and the sensing transistor ST are turned on at the same time, the data driver performs a sensing operation through the sensing line VREF, and thus, a data signal is controlled not to be output.

An object of the compensation according to the sensing result may be a data signal in a digital form, a data signal in an analog form, or a gamma voltage. The compensation circuit generating a compensation signal (or a compensation voltage) on the basis of the sensing result may be implemented as an internal circuit of the data driver, as an internal circuit of the timing controller, or as a separate circuit.

In FIG. 3, a subpixel having a 3-transistor/1-capacitor structure including the switching transistor SW, the driving transistor DR, the capacitor Cst, the OLED, and the sensing transistor ST is illustrated as an example. However, when a compensation circuit is added thereto, the subpixel may be configured to have a 3T2C, 4T2C, 5T1C, or 6T2C structure.

Meanwhile, the circuit of the subpixel proposed in the related art illustrated in FIG. 3 and a circuit of a subpixel according to the first embodiment of the present disclosure are different in the configuration of the light blocking layer LS. The light blocking layer LS is provided to serve to block ambient light. When the light blocking layer LS is formed of a metal, a problem in which a parasitic voltage is charged may arise, and thus, the light blocking layer LS is connected to the source electrode of the driving transistor DR.

As Illustrated in FIG. 3, in the related art, the light blocking layer LS is disposed only below a channel region of the driving transistor DR. In contrast, as illustrated in FIG. 4, in the first embodiment of the present disclosure, the light blocking layer LS is disposed below the channel regions of the switching transistor SW and the sensing transistor ST, as well as below the channel region of the driving transistor DR.

In the related art, the light blocking layer LS is formed to simply block ambient light. However, in the first embodiment of the present disclosure, the light blocking layer LS is utilized as an electrode to be connected to other electrode or line or to form a capacitor.

As illustrated in FIG. 5, subpixels are formed in the display area AA of a first substrate 150a on the basis of the circuit of the subpixel described above with reference to FIG. 4. The subpixels formed in the display area AA are sealed by a protection film (or a protection substrate) 150b. NA denotes a non-display area.

The subpixels are horizontally or vertically disposed in order of red (R), white (W), blue (B), and green (G) in the display area AA. The red (R), white (W), blue (B), and green (G) subpixels form a single pixel P. However, disposition order of the subpixels may be variously modified according to emission materials, emission areas, and configurations (or structures) of a compensation circuit.

When a display panel is manufactured on the basis of the circuit of the subpixel of FIG. 4, complexity of a layout design of the display panel may relatively be increased. The increase in complexity of the layout design of the display panel may lead to an increase in a region in which different kinds of lines (or wirings) overlap each other.

According to experiment results, the circuit of the subpixel of FIG. 4 has high generation frequency of a static electricity short, a short circuit due to a by-productor a by-product and static electricity in an overlap portion between the data line and the sensing line among the different kinds of lines. This problem causes a line defect in a specific line of a display surface of the display panel to result in defective image quality.

Hereinafter, the experiment results will further be described. However, dispositions of and connection relationships between the first to fourth subpixels and signal or power lines formed therearound will be briefly illustrated (specific connection relationships may be known through FIGS. 3 and 4, and thus, parts other than important parts will be simply described).

Figure 6:
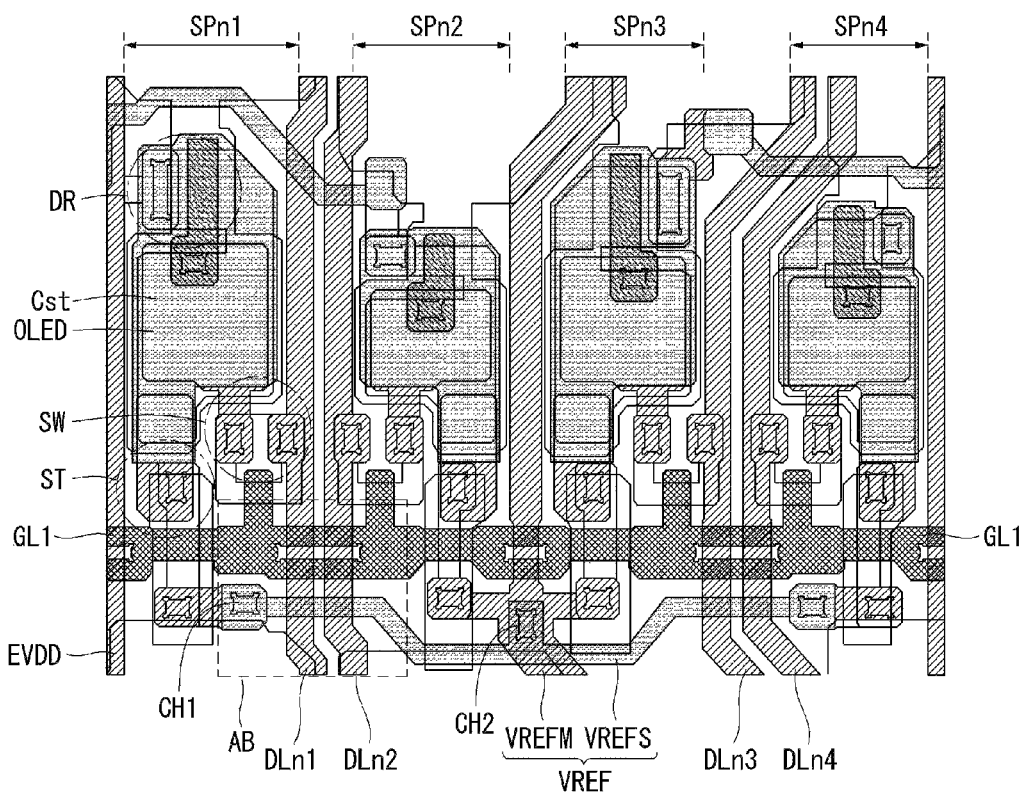
FIG. 6 is a plan view illustrating a portion of subpixels according to an experimental example.
Figure 7:
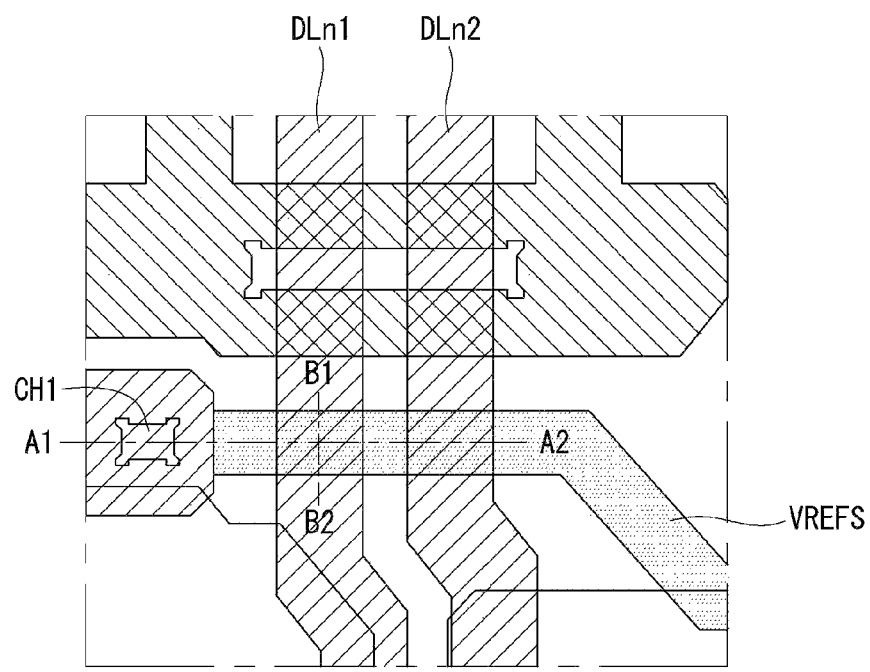
FIG. 7 is an enlarged view specifically illustrating a portion of FIG. 6.
Figure 8:
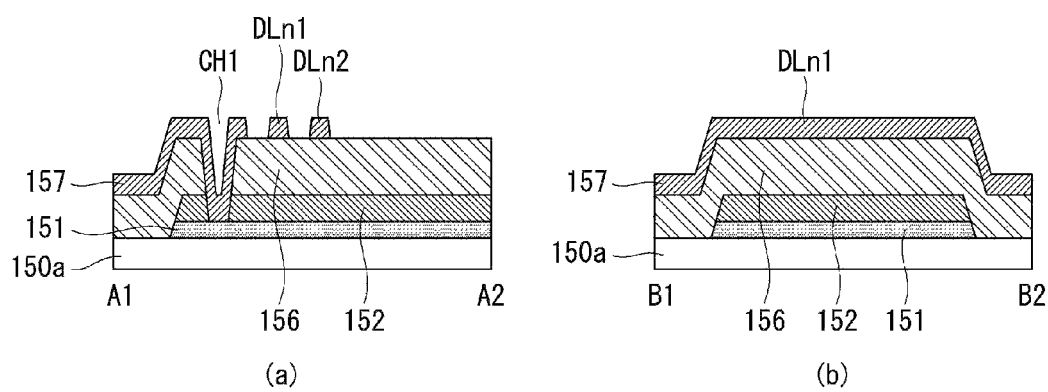
FIG. 8 is a cross-sectional view taken along lines A1-A2 and B1-B2 of FIG. 7.

FIG. 6 is a plan view illustrating a portion of subpixels according to an experimental example, FIG. 7 is an enlarged view specifically illustrating a portion of FIG. 6, and FIG. 8 is a cross-sectional view taken along lines A1-A2 and B1-B2 of FIG. 7.

As illustrated in FIGS. 6 through 8, in the display panel, first to fourth subpixels SPn1 to SPn4 form a pixel, and an amount of the subpixels corresponding to resolution is formed. For example, the first subpixel SPn1 may be selected as a red subpixel R, the second subpixel SPn2 may be selected as a white subpixel W, the third subpixel SPn3 may be selected as a blue subpixel B, and the fourth subpixel SPn4 may be selected as a green subpixel G.

A first power line EVDD is disposed on the left of the first subpixel SPn1 in a vertical direction. The first power line EVDD is commonly connected to the first subpixel SPn1 and the second subpixel SPn2. A first data line DLn1 and a second data line DLn2 are disposed between the first subpixel SPn1 and the second subpixel SPn2. The first data line DLn1 is connected to the first subpixel SPn1, and the second data line DLn2 is connected to the second subpixel SPn2.

A sensing line VREF is disposed on the left of the third subpixel SPn3 in a vertical direction. The sensing line VREF is commonly connected to the first subpixel SPn1 to fourth subpixel SPn4. A third data line DLn3 and a fourth data line DLn4 are disposed between the third subpixel SPn3 and the fourth subpixel SPn4. The third data line DLn3 is connected to the third subpixel SPn3, and the fourth data line DLn4 is connected to the fourth subpixel SPn4.

A scan line GL1 is disposed in a horizontal direction in a region of a sensing transistor ST included in each of the first subpixel SPn1 to fourth subpixel SPn4. The scan line GL1 is connected to gate electrodes of the sensing transistor ST and the switching transistor SW.

The sensing line VREF includes a vertical sensing line VREFM disposed in a vertical direction and a horizontal sensing line VREFS disposed in a horizontal direction. In an experimental example, in order to commonly connect the first subpixel SPn1 to the fourth subpixel SPn4, the horizontal sensing line VREFS is used as a connection electrode (or a bridge electrode).

The reason for using the connection electrode is because, since the data lines DLn1 to DLn4 are disposed between the first subpixel SPn1 and the second subpixel SPn2 and between the third subpixel SPn3 and the fourth subpixel SPn4, the first subpixel SPn1 to the fourth subpixel SPn4 need to be all connected to the sensing line VREF, while avoiding electrical connection between the data lines DLn1 to DLn4 and the first subpixel SPn1 to fourth subpixel SPn4.

In an experimental example, in order to connect the sensing line VREF to all of the first subpixel SPn1 to fourth subpixel SPn4, the horizontal sensing line VREFS is configured by using a light blocking layer 151 formed on a first substrate 150a and the horizontal sensing line VREFS and the vertical sensing line VREF are electrically connected.

As illustrated in FIG. 8, in the horizontal sensing line VERFS portion passing through regions of the first and second data lines DLn1 and DLn2 in an overlapping manner, a light blocking layer 151, a buffer layer 152, a second insulating layer 156, and a source/drain metal layer 157 are stacked. The horizontal sensing line VREFS is configured as the light blocking layer 151, and the light blocking layer 151 and the source/drain metal layer 157 are electrically connected through a first contact hole CH1.

A portion of the source/drain metal layer 157 forms the first and second data lines DLn1 and DLn2, and another portion thereof is electrically connected to the light blocking layer 151. Thus, the overlap portions between the data lines and the horizontal sensing line are defined as regions in which different kinds of lines cross each other.

Hereinafter, causes of generation of a short due to a static electricity short, or a short due to a by-product or a by-product and static electricity in the overlap portions between the data lines and the sensing line as different kinds of lines will be described.

Figure 9:
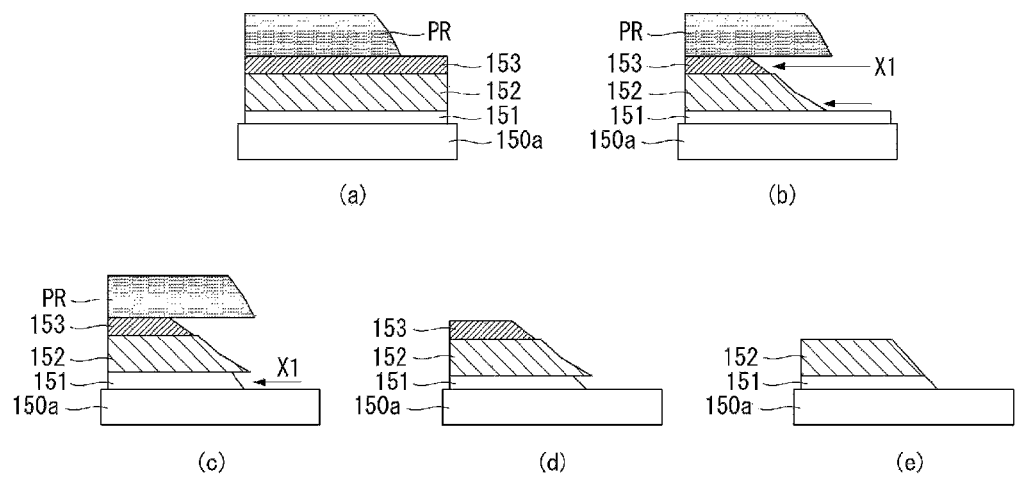
FIG. 9 includes cross-sectional views illustrating a portion of a process of forming a light blocking layer.
Figure 10:
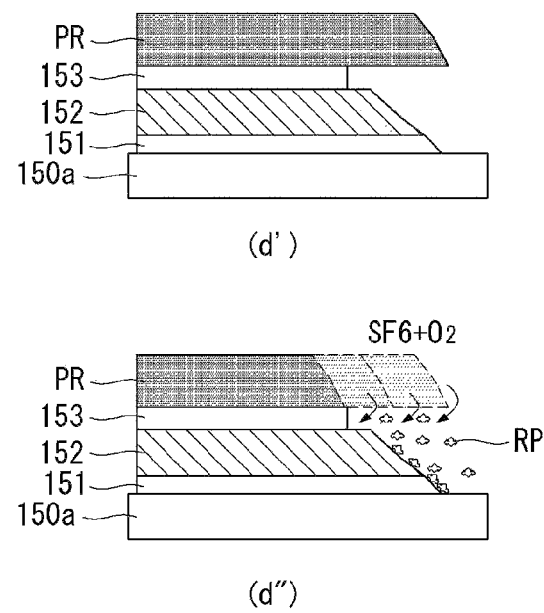
FIG. 10 is a view specifically illustrating a portion of the process illustrated in FIG. 9.
Figure 11:
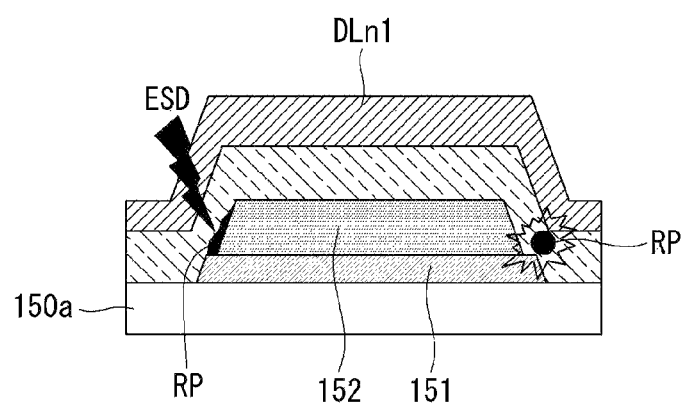
FIG. 11 is a cross-sectional view illustrating a problem arising in an overlap portion between a data line and a sensing line.
Figure 12:
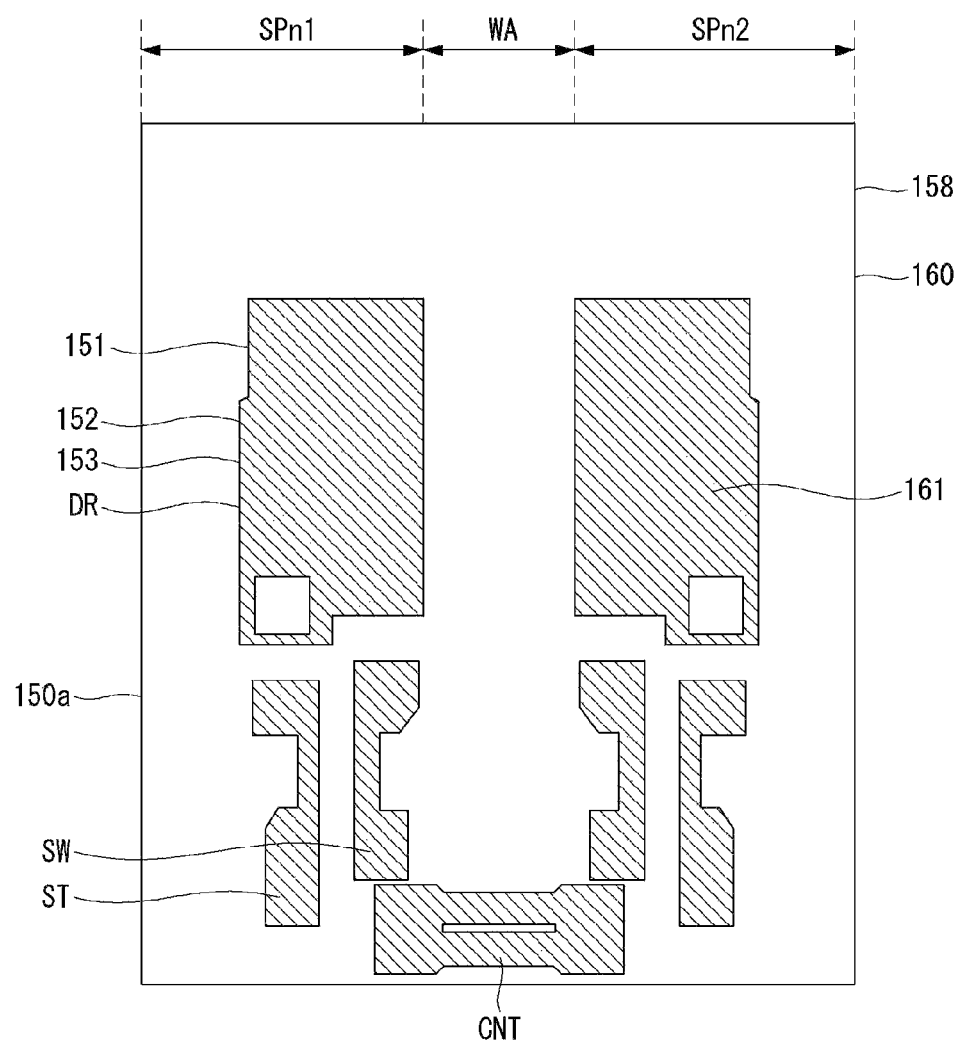
FIGS. 12 through 17 are views illustrating layers of a planar layout of a portion of a subpixel according to the first embodiment of the present disclosure.
Figure 13:
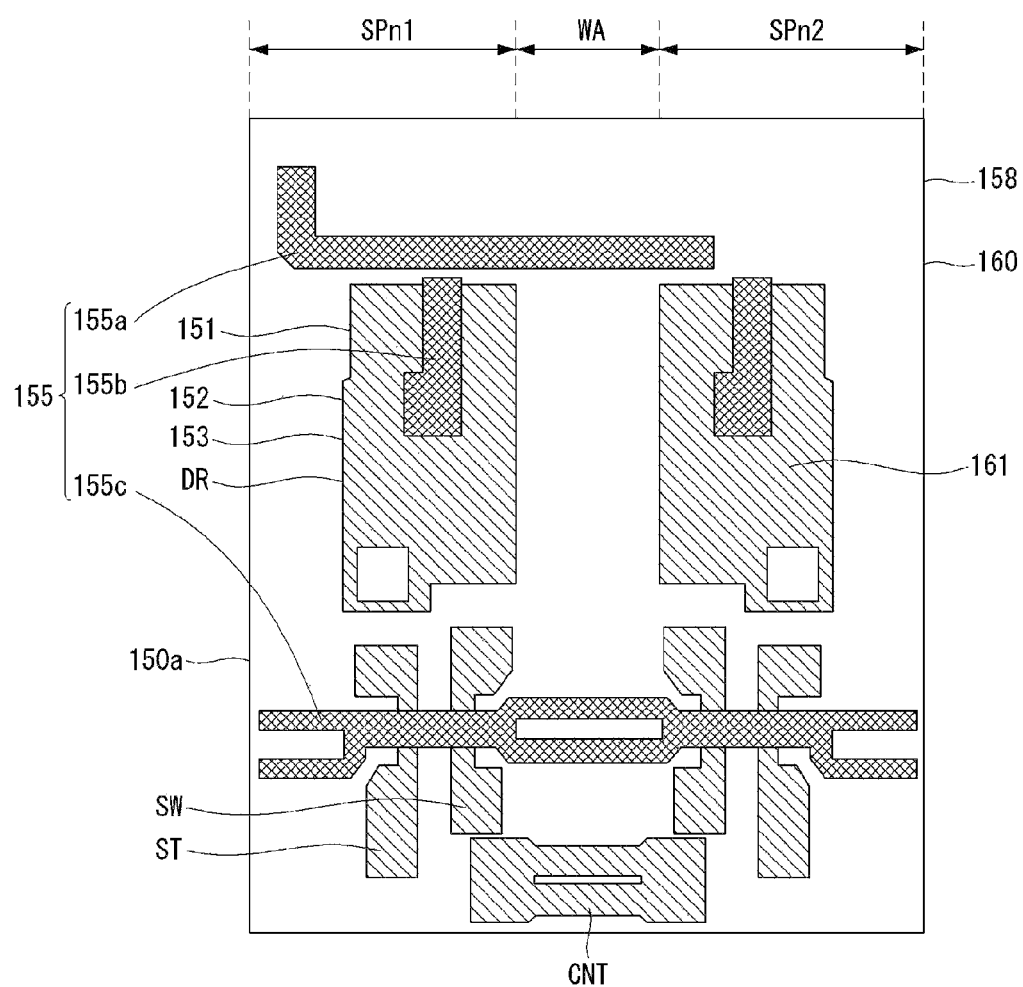
Figure 14:
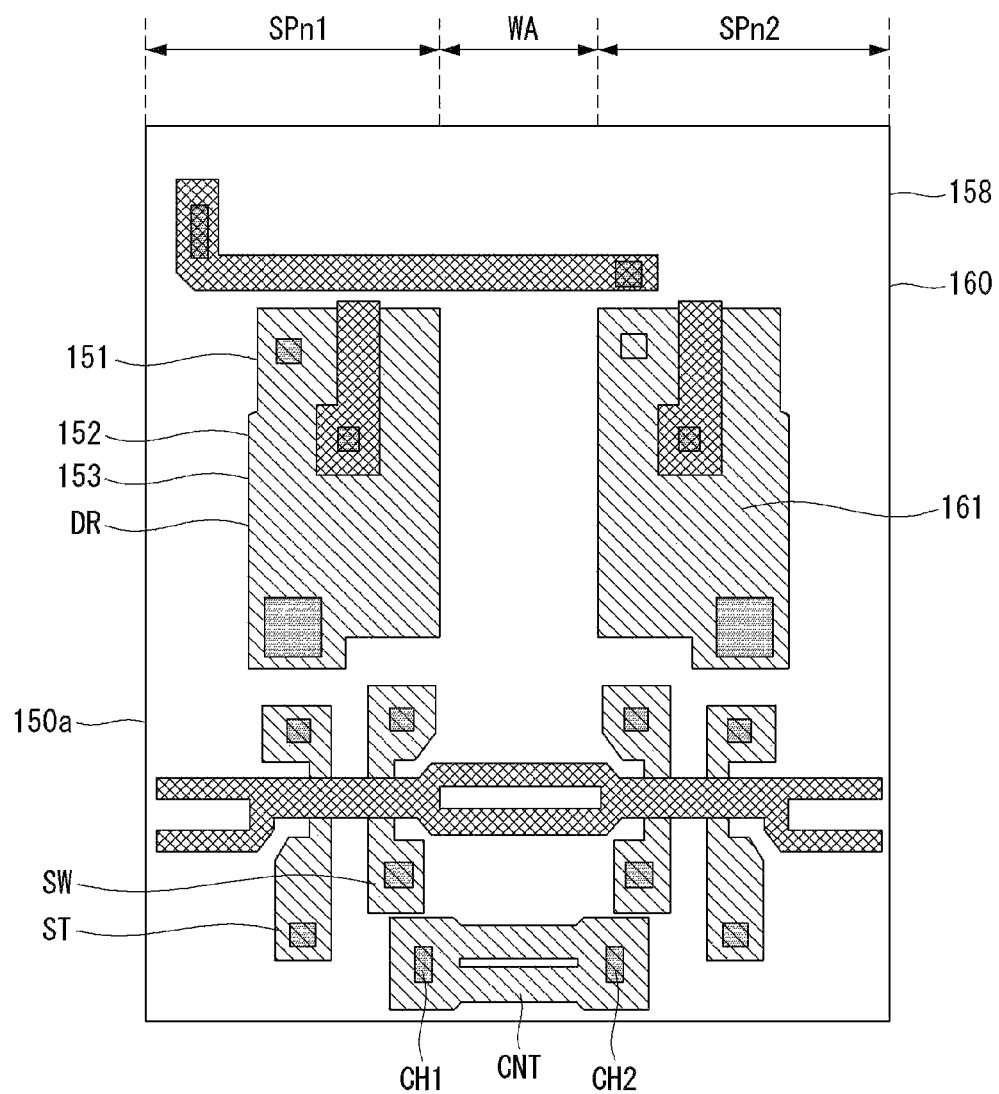
Figure 15:
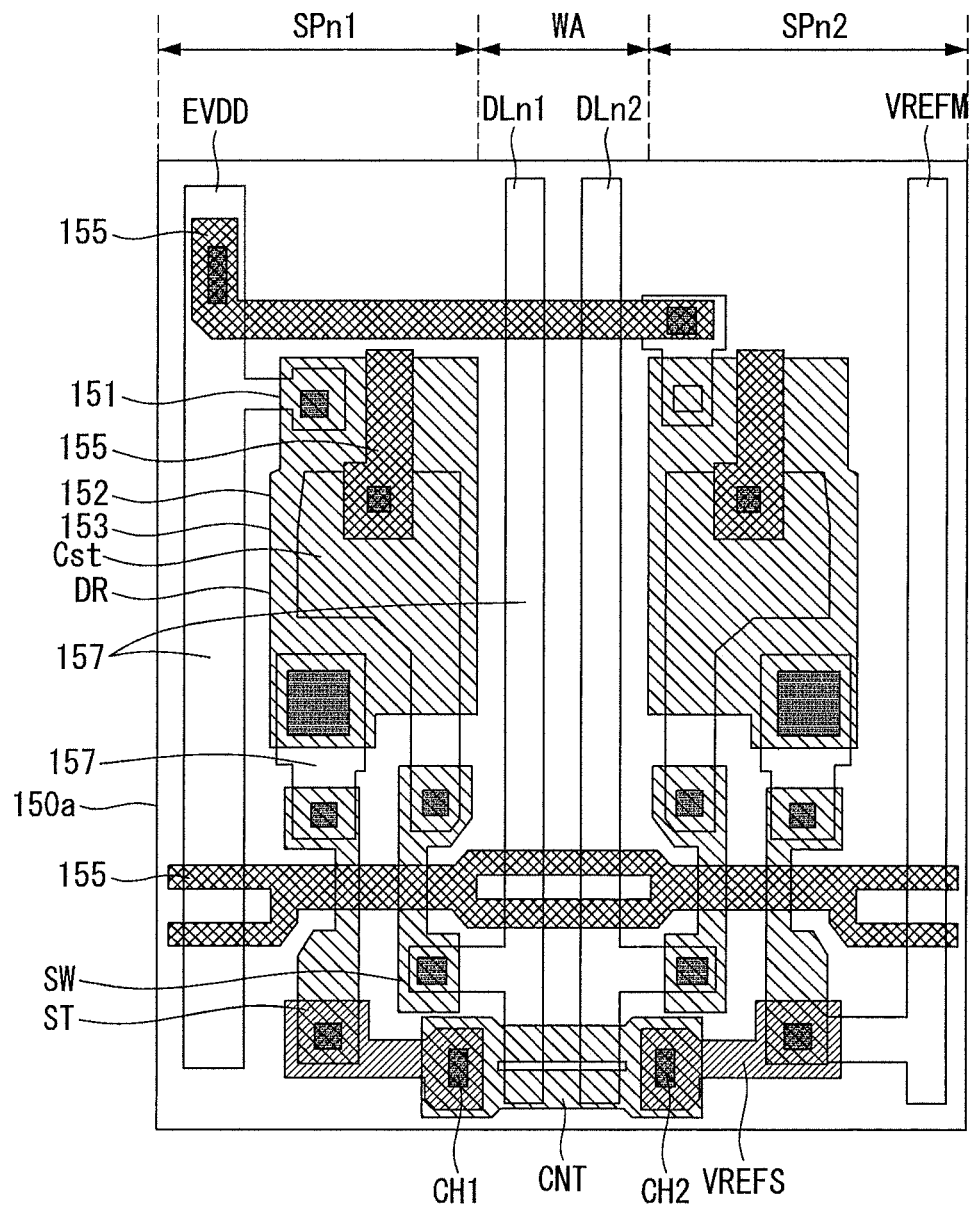
Figure 16:
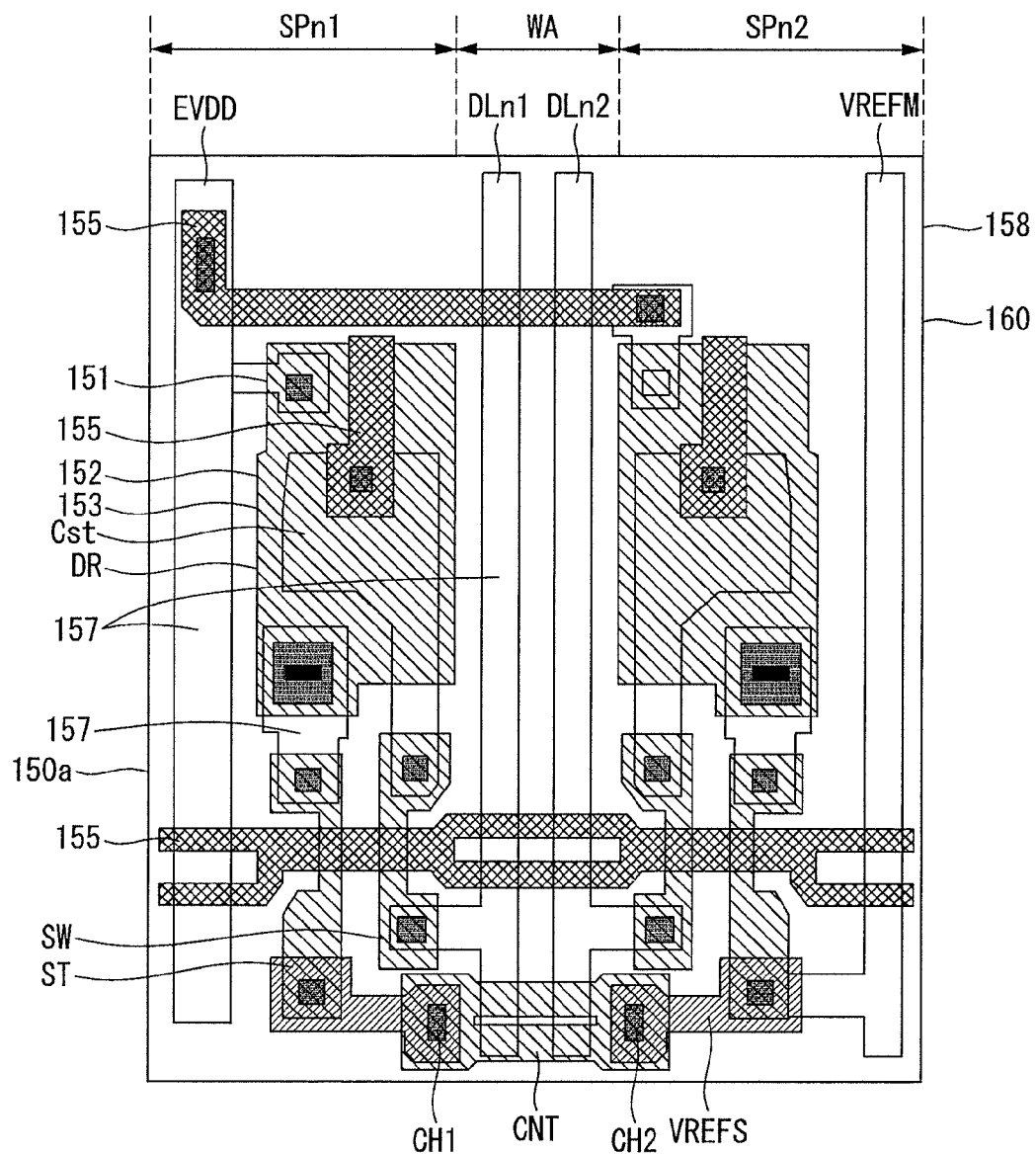

FIG. 9 includes cross-sectional views illustrating a portion of a process of forming a light blocking layer, FIG. 10 is a view specifically illustrating a portion of the process illustrated in FIG. 9, and FIG. 11 is a cross-sectional view illustrating a problem arising in an overlap portion between a data line and a sensing line.

As illustrated in (a) of FIG. 9, a light blocking layer 151, a buffer layer 152, a semiconductor layer 153, and photoresist PR are formed on a first substrate 150a, and the photoresist PR is patterned to a specific shape using a half-tone mask. As illustrated in (b) of FIG. 9, portions of the buffer layer 152, and the semiconductor layer 153 formed below the photoresist PR are etched using a first etchant (for example, a BOE). As illustrated in (c) of FIG. 9, a portion of the light blocking layer 151 is etched using a second etchant (for example, a copper (Cu) etchant). As illustrated in (d) of FIG. 9, the photoresist PR is entirely removed through ashing. As illustrated in (e) of FIG. 9, tips protruding from a portion of the semiconductor layer 153 and from each layer are removed using a strip process, or the like.

The horizontal sensing line is formed of the light blocking layer 151, and the source/drain metal layer passes through regions of the horizontal sensing line in an overlapping manner. Thus, the horizontal sensing line is formed through the aforementioned process. However, when the display panel is manufactured through the aforementioned process, a static electricity short, a short due to a by-product or the by-product and static electricity are generated in the overlap portions between the data line and the sensing line, so causes thereof were reviewed and researched.

As illustrated in (d') and (d") of FIG. 10, the results show that residuals (hereinafter, referred to as a "by-product") of the photoresist PR and the buffer layer 152 cling to an interface between the light blocking layer 151 and the buffer layer 152. A second insulating layer is formed on the buffer layer 152, but it is not easy to eliminate a problem of interface non-uniformity (unstable uniformity) only with the thickness of the second insulating layer.

Thus, as illustrated in FIG. 11, since the interface of the overlap portion between the data line DLn1 and the light blocking layer 151 forming the horizontal sensing line is not uniform, having a high possibility of generation of a short due to a static electricity short (ESD), a short due to the by-product or the by-product and static electricity, and thus, an improvement thereof is required.

Various experiments were conducted to solve the problem occurring in the experimental example, and the problem was improved and/or prevented through the following embodiments.

Figure 17:
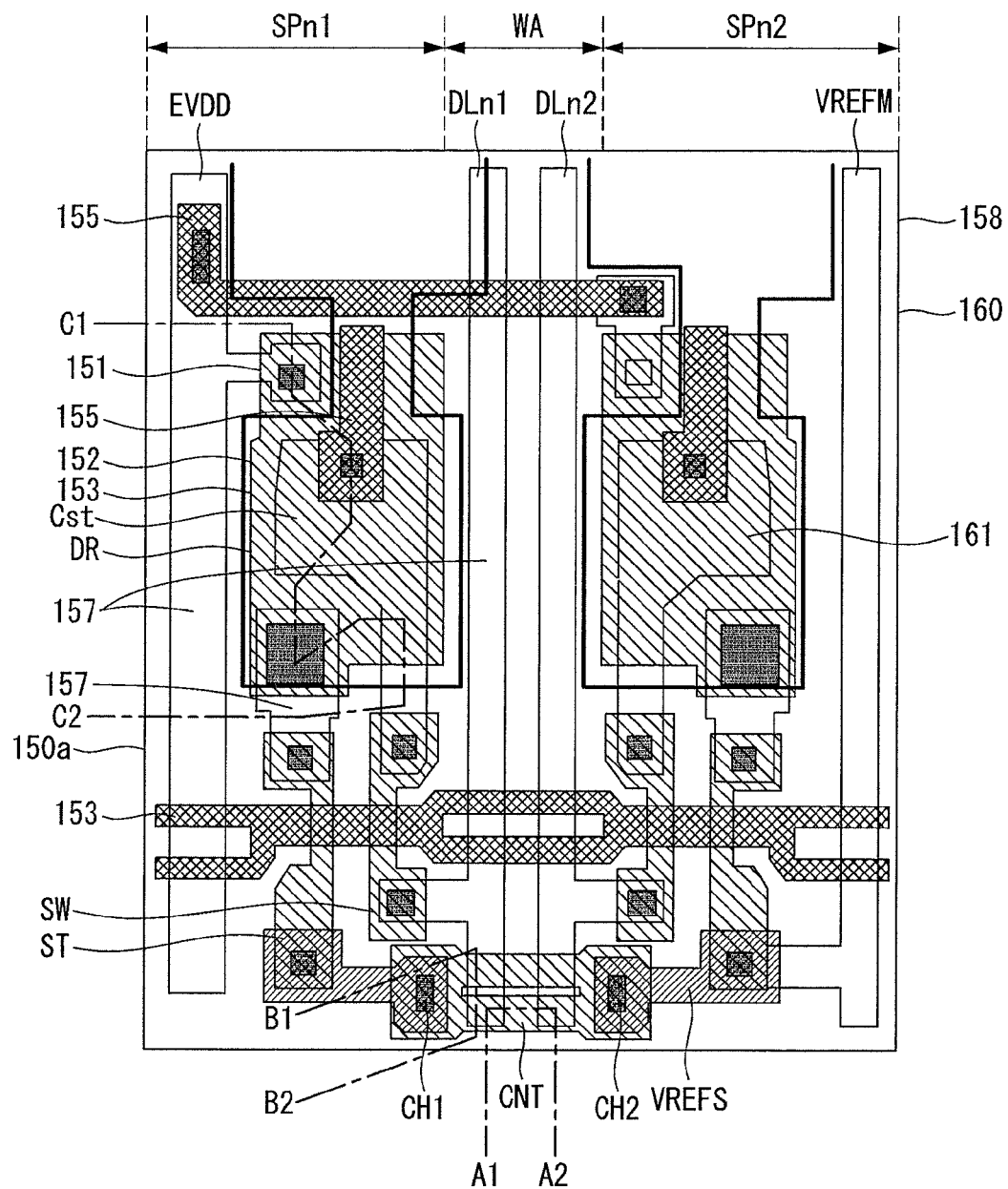
Figure 18:
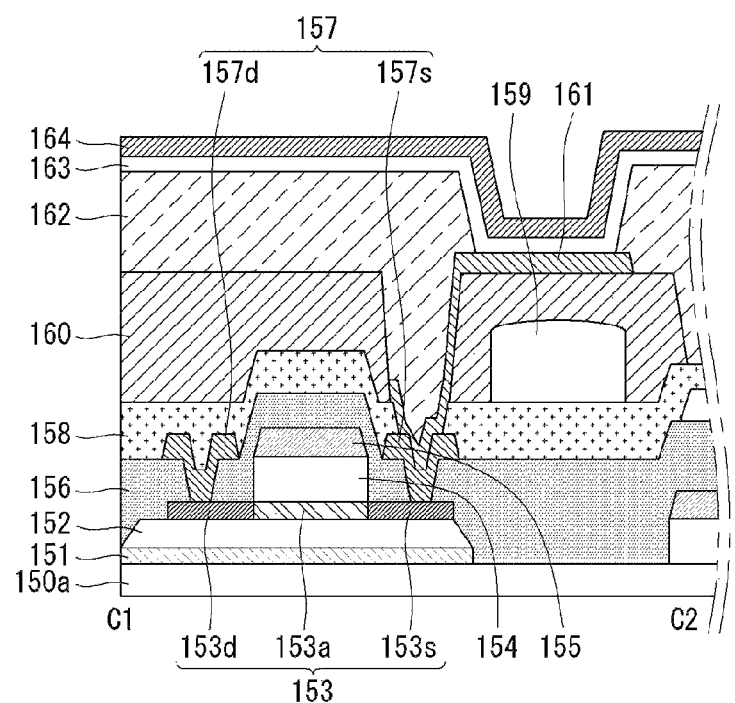
FIG. 18 is a cross-sectional view taken along line C1-C2 of FIG. 17.

FIGS. 12 through 17 are views illustrating layers of a planar layout of a portion of a subpixel according to the first embodiment of the present disclosure, and FIG. 18 is a cross-sectional view taken along line C1-C2 of FIG. 17. Here, FIGS. 12 through 17 are mainly based on a circuit region of the subpixel, and thus an emission region (which is present above a circuit region) is rarely seen.

As illustrated in FIGS. 12 through 18, in the display panel, first and second subpixels SPn1 and SPn2 are disposed in a horizontal direction. As can be seen from the experimental example of FIG. 6, one pixel includes four subpixels, and an amount of the subpixels corresponding to resolution is formed. For example, the first subpixel SPn1 may be selected as a red subpixel R, the second subpixel SPn2 may be selected as a white subpixel W, a third subpixel (not shown) may be selected as a blue subpixel, and a fourth subpixel (not shown) may be selected as a green subpixel. However, this is merely an example, a pixel may include three subpixels and a color disposition thereof may be variously modified, without being limited thereto.

A first power line EVDD is disposed on the left of the first subpixel SPn1 in a vertical direction. The first power line EVDD is commonly connected to the first subpixel SPn1 and the second subpixel SPn2. A first data line DLn1 and a second data line DLn2 are disposed between the first subpixel SPn1 and the second subpixel SPn2. The first data line DLn1 is connected to the first subpixel SPn1, and the second data line DLn2 is connected to the second subpixel SPn2.

A scan line GL1 is disposed in a horizontal direction in a region of a sensing transistor ST included in each of the first subpixel SPn1 and the second subpixel SPn2. The scan line GL1 is connected to gate electrodes of the sensing transistor ST and the switching transistor SW.

A process of forming the first subpixel SPn1 and the second subpixel SPn2 will be described briefly according to process order.

A light blocking layer 151 is formed on a first substrate 150a and divided to correspond to channel regions of the driving transistor DR, the sensing transistor ST, and the switching transistor SW, respectively. Also, the light blocking layer 151 is utilized as a connection electrode CNT serving to electrically connect the horizontal sensing lines, and thus, the light blocking layer 151 is divided to correspond to the first subpixel SPn1 and the second subpixel SPn2. The connection electrode CNT may be branched to at least two lines in a region in which the connection electrode CNT overlaps the data line. In this case, parasitic capacitance between the connection electrode CNT and the data line may be reduced.

As can be seen from the process of FIG. 9, the light blocking layer 151, the buffer layer 152, the semiconductor layer 153, and the photoresist PR stacked on the first substrate 150a are patterned. Thus, the layers forming the configuration illustrated in FIG. 12 include the light blocking layer 151, the buffer layer 152, and the semiconductor layer 153. That is, the light blocking layer 151, the buffer layer 152, and the semiconductor layer 153 are patterned by the same mask, and these layers may all be patterned in the form of an island. In the semiconductor layer 153, a source region and a drain region are changed to metal through a metallization process. However, a partial region (for example, a channel region) of the semiconductor layer 153 is not changed to metal.

A first insulating layer 154 is formed on the semiconductor layer 153, and a gate metal layer 155 is formed on the first insulating layer 154. The first insulating layer 154 may be defined as a gate insulating layer, and the gate insulating layer may be patterned in the form of an island, like the gate electrode formed thereabove.

The gate metal layer 155 includes a first gate metal layer 155a electrically connecting the first subpixel SPn1 and the second subpixel SPn2 with the first power line EVDD. The first gate metal layer 155a may be patterned as an electrode having an L shape to commonly connect the first power line EVDD with the first subpixel SPn1 and the second subpixel SPn2.

The gate metal layer 155 includes a second gate metal layer 155b divided to correspond to the driving transistors DR of the first subpixel SPn1 and the second subpixel SPn2. The second gate metal layer 155b becomes a gate electrode of the driving transistor DR. The second gate metal layer 155b may be patterned as a bar-shaped electrode longer in a vertical direction.

The gate metal layer 155 includes a third gate metal layer 155c divided to correspond to the switching transistor SW and the sensing transistor ST of the first subpixel SPn1 and the second subpixel SPn2. The third gate metal layer 155c becomes gate electrodes of the switching transistor SW and the sensing transistor ST. The third gate metal layer 155c may be disposed in a horizontal direction and patterned to be branched into at least two lines in an outer region of the subpixels. In this case, parasitic capacitance between the third gate metal layer 155c and the data line, the first power line, and the sensing line intersecting with the third gate metal layer 155c can be reduced.

A second insulating layer 156 is formed on the gate metal layer 155. The second insulating layer 156 may be defined as an interlayer insulating layer electrically insulting a lower structure and a structure formed at an upper side. A plurality of contact holes exposing portions of the lower structure are formed in the second insulating layer 156. The plurality of contact holes are formed by a hole mask. A first contact hole CH1 and a second contact hole CH2 exposing portions of the connection electrode CNT are formed on one side and the other side of the connection electrode CNT by the hole mask.

A source/drain metal layer 157 is formed on the second insulating layer 156. The source/drain metal layer 157 is divided into lines forming the first power line EVDD, the data lines DLn1 and DLn2, and the sensing line VREF, and electrodes forming the transistors included within the subpixels and a capacitor.

Referring to the driving transistor DR part corresponding to a portion of the source/drain metal layer 157, the source/drain metal layer 157 is connected to semiconductor layers 153s and 153d of a source region and a drain region to become a source electrode 157s and a drain electrode 157d of the driving transistor DR, respectively. A semiconductor layer 153a of a channel region is protected by the light blocking layer 151.

A third insulating layer 158 is formed on the source/drain metal layer 157. The third insulating layer 158 may be defined as a protective layer for protecting a transistor formed on the first substrate 150a.

A color filter 159 is formed to correspond to an opening region on the third insulating layer 158. When an OLED formed therebelow emits white light, the color filter 159 is formed on the third insulating layer 158. However, when the OLED emits colored light such as red light, green light, and blue light, the color filter 159 is not formed on the third insulating layer 158.

A fourth insulating layer 160 is formed on the third insulating layer 158. The fourth insulating layer 160 may be defined as a coating layer planarizing the surface. The third insulating layer 158 and the fourth insulating layer 160 may have a contact hole exposing a portion of the source electrode 157s.

A pixel electrode 161 is formed on the fourth insulating layer 160. The pixel electrode 161 may be defined as an anode electrode of the OLED. The pixel electrode 161 is electrically connected to the exposed source electrode 157s through the fourth insulating layer 160. The pixel electrode 161 may be selectively provided as a transparent electrode for allowing light emitted from an organic emission layer to exit in a direction toward the first substrate 150a.

A bank layer 162 is formed on the fourth insulating layer 160. The bank layer 162 has an opening region exposing a portion of the pixel electrode 161, and defines a substantial emission region.

An organic emission layer 163 is formed on the bank layer 162. The organic emission layer 163 is a layer emitting light, which may emit white light or colored light such as red light, green light, or blue light. The organic emission layer 163 may further include functional layers such as a hole injection layer, a hole transport layer, an electron transport layer, and an electron injection layer, or compensation layers such as a hole blocking layer and an interlayer buffer layer, in addition to an emission layer.

An upper electrode 164 is formed on the organic emission layer 163. The upper electrode 164 may be defined as a cathode electrode of the OLED. The upper electrode 164 is electrically connected to a second power line (not shown). The upper electrode 164 may be selectively provided as an opaque electrode allowing light emitted from the organic emission layer to exit only in the direction toward the first substrate 150a. However, in order to allow light emitted from the organic emission layer to exit in a direction opposite to the first substrate 150a according to purposes or functions of display panels, the upper electrode 164 may also be selectively provided as a transparent electrode.

In addition, a capacitor Cst is formed in each of the first subpixel SPn1 and the second subpixel SPn2. The capacitors Cst may be formed as capacitors having a dual-layer structure using a portion of the light blocking layer, a portion of the semiconductor layer, a portion of the source/drain metal layer, and a portion of the pixel electrode. When the capacitors Cst are formed in this manner, capacitance of the capacitor may be increased even within a narrow area. However, this is merely an example and the capacitors Cst may be defined to have various shapes, without being limited thereto.

The sensing transistors ST of the first subpixel SPn1 and the second subpixel SPn2 are electrically connected to a vertical sensing line VREFM by the horizontal sensing line VREFS and the connection electrode CNT.

Hereinafter, embodiments for solving the problem arising in the overlap portion between the data line and the sensing line are explained.

Figure 19:
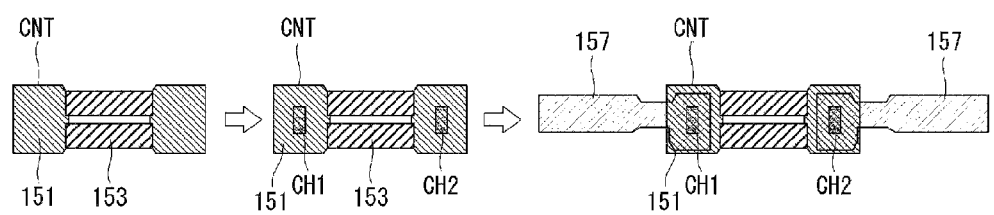
FIGS. 19 and 20 are a plan view and a cross-sectional view illustrating a connection structure according to a first embodiment of the present disclosure.
Figure 20:
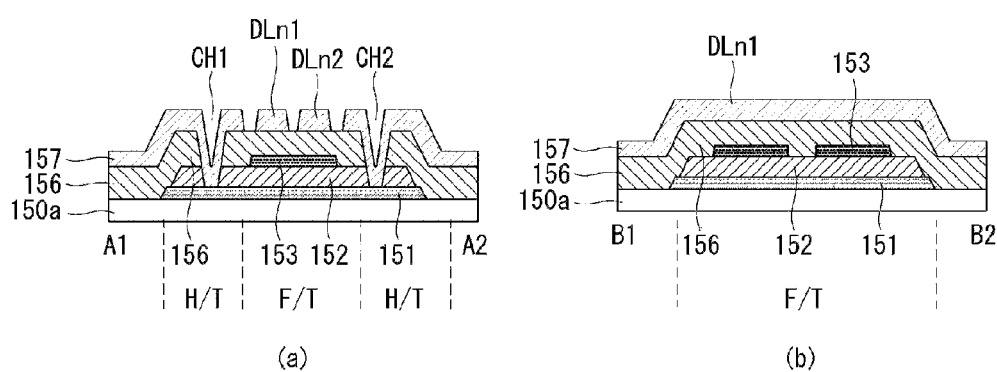
Figure 21:
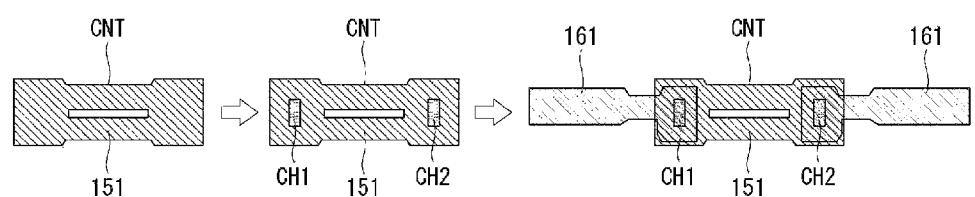
FIGS. 21 and 22 are a plan view and a cross-sectional view illustrating a connection structure according to a second embodiment of the present disclosure.
Figure 22:
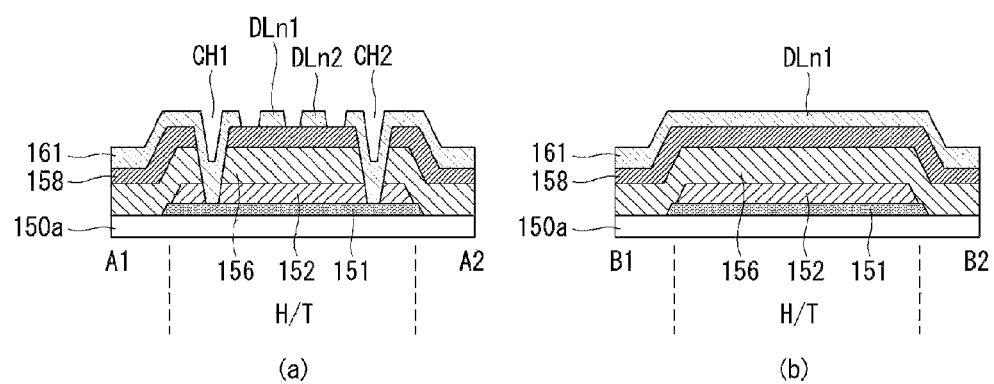
Figure 23:
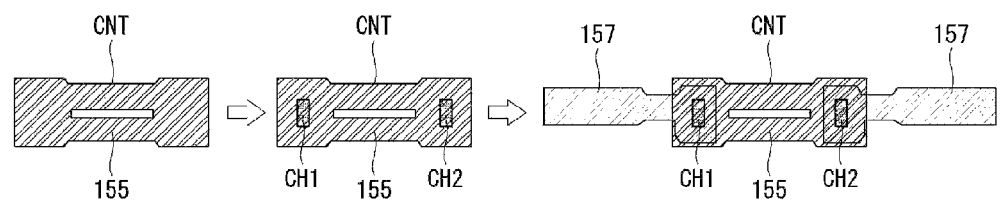
FIGS. 23 and 24 are a plan view and a cross-sectional view illustrating a connection structure according to a third embodiment of the present disclosure.
Figure 24:
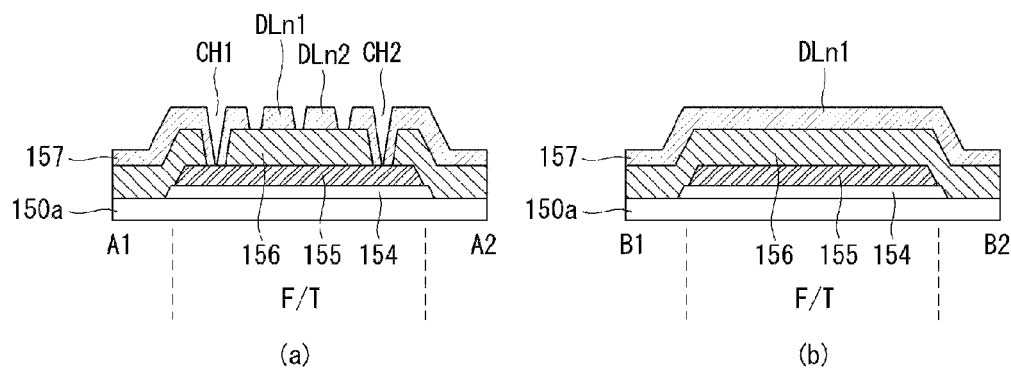

FIGS. 19 and 20 are a plan view and a cross-sectional view illustrating a connection structure according to a first embodiment of the present disclosure, FIGS. 21 and 22 are a plan view and a cross-sectional view illustrating a connection structure according to a second embodiment of the present disclosure, and FIGS. 23 and 24 are a plan view and a cross-sectional view illustrating a connection structure according to a third embodiment of the present disclosure.

As illustrated in FIGS. 19 and 20, in the first embodiment of the present disclosure, a dummy semiconductor layer 153 is formed in a direction in which the connection electrode CNT is jumped, that is, in a horizontal direction (or a direction intersecting with the data line). The dummy semiconductor layer 153 is positioned in an overlap region (or an overlap portion) between the connection electrode CNT and the data line. The dummy semiconductor layer 153 serves to increase an interlayer thickness of the overlap region (or the overlap portion) between the connection electrode CNT and the data line. The connection electrode CNT is branched into at least two lines from the overlap region with the data line. Thus, the dummy semiconductor layer 153 is also branched to correspond to the two lines.

When the connection electrode (CNT) part is viewed in a first cross-sectional (A1-A2) direction, the light blocking layer 151, the buffer layer 152, the dummy semiconductor layer 153, the second insulating layer 156, and the source/drain metal layer 157 are present on the first substrate 150a. Here, in the source/drain metal layer 157, portions becoming the first and second data lines DLn1 and DLn2 and a portion becoming the horizontal sensing line are shown.

The source/drain metal layer 157 (one portion) corresponding to the horizontal sensing line of the first subpixel is connected to the light blocking layer 151 as a connection electrode through a first contact hole CH1. The source/drain metal layer 157 (the other portion) corresponding to the horizontal sensing line of the second subpixel is connected to the light blocking layer 151 as a connection electrode through a second contact hole CH2. Thus, the dummy semiconductor layer 153 is positioned between the first contact hole CH1 and the second contact hole CH2.

When the connection electrode CNT part is viewed in a second cross-sectional (B1-B2) direction, the light blocking layer 151, the buffer layer 152, the dummy semiconductor layer 153, the second insulating layer 156, and the source/drain metal layer 157 are present on the first substrate 150a. Here, in the source/drain metal layer 157, only the portion becoming the first data lines DLn1 is shown.

As in the first embodiment, when the dummy semiconductor layer 153 is formed on the region in which the connection electrode (CNT) is formed, a short between the data line and the sensing line that is not solved by only the thickness of the second insulating layer 156 may be improved and prevented.

The reason is because, since the dummy semiconductor layer 153 is further present, a distance between the light blocking layer 151 as a connection electrode CNT and the source/drain metal layer 157 is increased and an interface of a tapered portion is improved. Also, since the distance between the light blocking layer 151 and the source/drain metal layer 157 is increased and the tapered configuration is improved, a probability of introduction of static electricity by the medium of a by-product is lowered.

In order to form the electrode having such a structure as in the first embodiment of the present disclosure, after photoresist PR is formed, a masking process is required to pattern the photoresist PR to have a specific shape. During the masking process, a halftone mask (H/T) may be applied to the first and second contact holes CH1 and CH2 part and a full tone mask (F/T) may be applied to the overlap portion between the data line in which the dummy semiconductor layer 153 is present and the sensing line, but the present disclosure is not limited thereto.

As illustrated in FIGS. 21 and 22, in the second embodiment of the present disclosure, the pixel electrode 161 is used as a horizontal sensing line connected to the connection electrode CNT. That is, during a process of forming the pixel electrode 161, the connection electrode CNT and the horizontal sensing line are electrically connected.

When the connection electrode CNT is viewed in the first cross-sectional (A1-A2) direction, the light blocking layer 151, the buffer layer 152, the second insulating layer 156, the third insulating layer 158, and the pixel electrode 161 are present. Here, in the pixel electrode 161, portions becoming the first and second data lines DLn1 and DLn2 and a portion becoming the horizontal sensing line are shown.

The pixel electrode 161 (one portion) corresponding to the horizontal sensing line of the first subpixel is connected to the light blocking layer 151 as a connection electrode through the first contact hole CH1. The pixel electrode 161 (the other portion) corresponding to the horizontal sensing line of the second subpixel is connected to the light blocking layer 151 as a connection electrode through the second contact hole CH2.

When the connection electrode (CNT) part is viewed in a second cross-sectional (B1-B2) direction, the light blocking layer 151, the buffer layer 152, the second insulating layer 156, the third insulating layer 158, and the pixel electrode 161 are present on the first substrate 150a. Here, in the pixel electrode 161, only a portion becoming the first data line DLn1 is shown.

As in the second embodiment, when the pixel electrode 161 is used as the horizontal sensing line connected to the connection electrode CNT, a short between the data line and the sensing line not solved by only the thickness of the second insulating layer 156 may be improved and prevented.

The reason is because, since the pixel electrode 161 present at a position higher than the source/drain metal layer is used, a distance between the light blocking layer 151 as a connection electrode CNT and the pixel electrode 161 is increased. Also, since the distance between the light blocking layer 151 and the pixel electrode 161 is increased, a probability of introduction of static electricity by the medium of a by-product is lowered.

In order to form the electrode having such a structure as in the second embodiment of the present disclosure, a halftone mask (H/T) may be used in the first and second contact CH1 and CH2 parts and the overlap portion between the data line and the sensing line, but the present disclosure is not limited thereto.

As illustrated in FIGS. 23 and 24, in the third embodiment of the present disclosure, the gate metal layer 155 is used as a connection electrode CNT and the source/drain metal layer 157 is used as a horizontal sensing line. That is, during the process of forming the gate metal layer 155, the connection electrode CNT is formed, and during the process of forming the source/drain metal layer 157, the horizontal sensing line is electrically connected.

When the connection electrode CNT is viewed in the first cross-sectional (A1-A2) direction, the first insulating layer 154, the gate metal layer 155, the second insulating layer 156, and the source/drain metal layer 157 are present. Here, in the source/drain metal layer 157, portions becoming the first and second data lines DLn1 and DLn2 and a portion becoming the horizontal sensing line are shown.

The gate metal layer 155 (one portion) corresponding to the horizontal sensing line of the first subpixel is connected to the light blocking layer 151 as a connection electrode through the first contact hole CH1. The gate metal layer 155 (the other portion) corresponding to the horizontal sensing line of the second subpixel is connected to the light blocking layer 151 as a connection electrode through the second contact hole CH2.

When the connection electrode (CNT) part is viewed in the second cross-sectional (B1-B2) direction, the first insulating layer 154, the gate metal layer 155, the second insulating layer 156, and the source/drain metal layer 157 are present on the first substrate 150a. Here, in the source/drain metal layer 157, only a portion becoming the first data line DLn1 is shown.

As in the third embodiment, when the gate metal layer 155 is used as a connection electrode CNT and the source/drain metal layer 157 is used as a horizontal sensing line, a problem of generation of a by-product is eliminated. Thus, since the use of the gate metal layer 155 and the source/drain metal layer 157 in forming the sensing line removes a factor causing generation of a by-product, a short between the data line and the sensing line may be improved and prevented.

The reason is because, the use of the light blocking layer 151 causes generation of a by-product according to the process of etching the buffer layer, but in the case of using such a process as in the third embodiment, since the light blocking layer 151 and the buffer layer 152 generating a by-product are not present, a probability of introduction of static electricity by the medium of a by-product is lowered.

In order to form the electrode having such a structure as in the third embodiment of the present disclosure, a halftone mask (H/T) may be used in the first and second contact CH1 and CH2 parts and the overlap portion between the data line and the sensing line, but the present disclosure is not limited thereto.

Hereinafter, an example of manufacturing a first display panel and a second display panel using an embodiment of the present disclosure will be described. Here, the first display panel is smaller than the second display panel.

Figure 25:
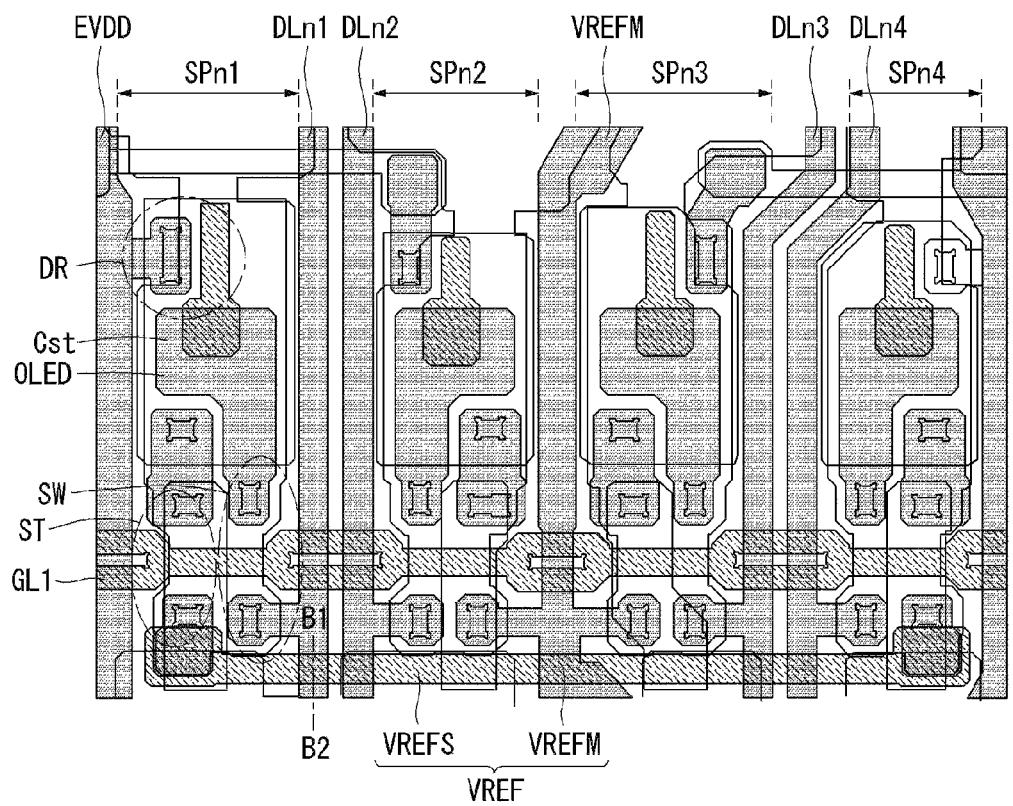
FIGS. 25 and 26 are a plan view illustrating a portion of subpixels of a first display panel manufactured on the basis of an embodiment of the present disclosure and cross-sectional views illustrating an improved portion.
Figure 26:
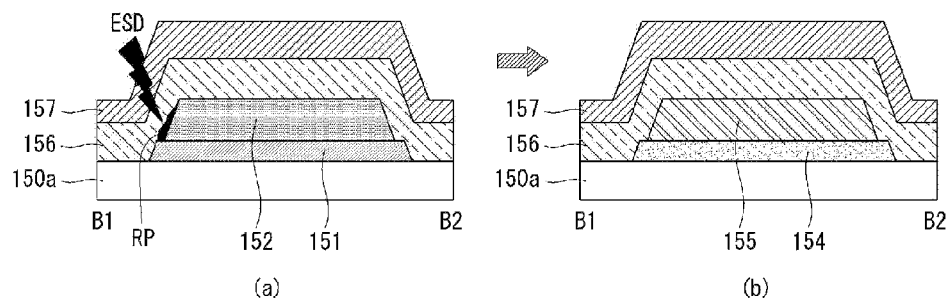
Figure 27:
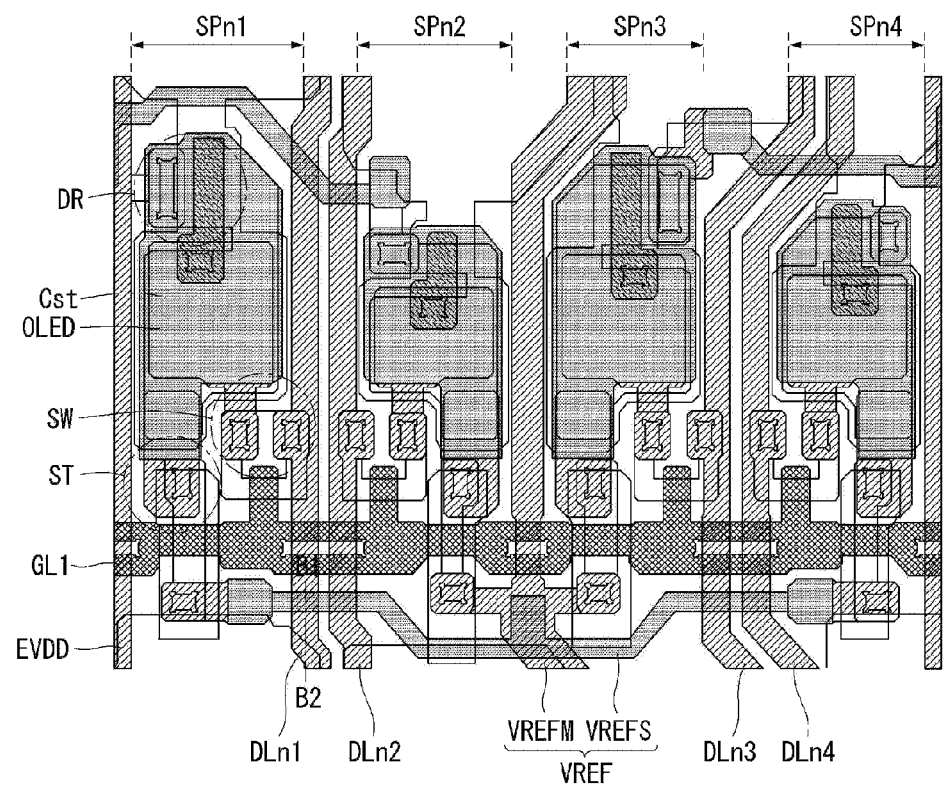
FIGS. 27 and 28 are a plan view illustrating a portion of subpixels of a second display panel manufactured on the basis of an embodiment of the present disclosure and cross-sectional views illustrating an improved portion.
Figure 28:
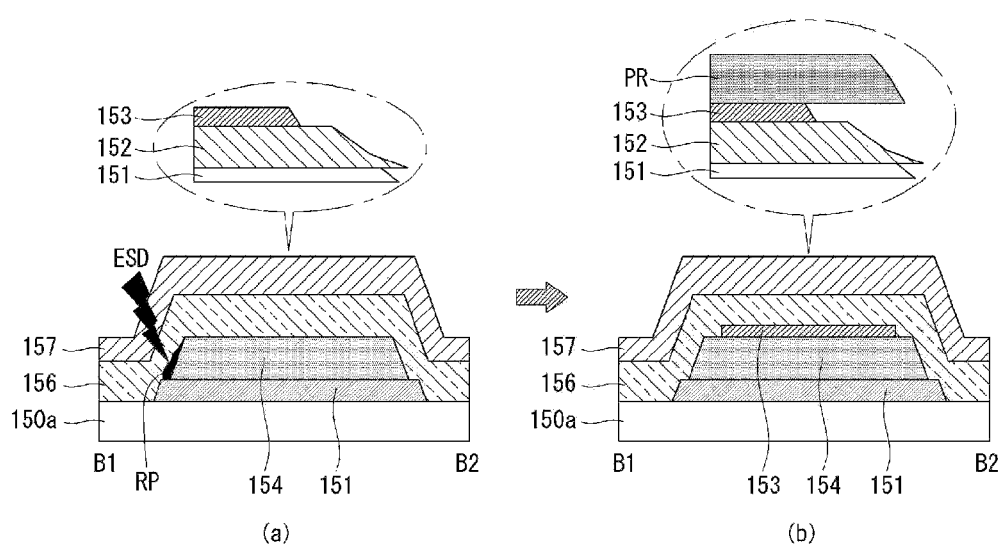

FIGS. 25 and 26 are a plan view illustrating a portion of subpixels of a first display panel manufactured on the basis of an embodiment of the present disclosure and cross-sectional views illustrating an improved portion, and FIGS. 27 and 28 are a plan view illustrating a portion of subpixels of a second display panel manufactured on the basis of an embodiment of the present disclosure and cross-sectional views illustrating an improved portion.

As illustrated in FIGS. 25 and 26, in the first display panel, first to fourth subpixels SPn1 to SPn4 form a pixel, and an amount of the subpixels corresponding to resolution is formed.

A first power line EVDD is disposed on the left of the first subpixel SPn1 in a vertical direction. The first power line EVDD is commonly connected to the first subpixel SPn1 and the second subpixel SPn2. A first data line DLn1 and a second data line DLn2 are disposed between the first subpixel SPn1 and the second subpixel SPn2. The first data line DLn1 is connected to the first subpixel SPn1, and the second data line DLn2 is connected to the second subpixel SPn2.

A sensing line VREF is disposed on the left of the third subpixel SPn3 in a vertical direction. The sensing line VREF includes a vertical sensing line VREFM disposed in a vertical direction and a horizontal sensing line VREFS disposed in a horizontal direction. The sensing line VREF is commonly connected to the first subpixel SPn1 to fourth subpixel SPn4. A third data line DLn3 and a fourth data line DLn4 are disposed between the third subpixel SPn3 and the fourth subpixel SPn4. The third data line DLn3 is connected to the third subpixel SPn3, and the fourth data line DLn4 is connected to the fourth subpixel SPn4.

A scan line GL1 is disposed in a horizontal direction in a region of a sensing transistor ST included in each of the first subpixel SPn1 to fourth subpixel SPn4. The scan line GL1 is connected to gate electrodes of the sensing transistor ST and the switching transistor SW.

Results of configuring the experimental example using such a connection structure as that of (a) of FIG. 26 show the presence of a short between the data line and the sensing line. In order to improve this problem, in manufacturing the first display panel, a structure of the connection electrode is changed on the basis of the third embodiment as illustrated in (b) of FIG. 26.

As described above in the third embodiment, when the gate metal layer 155 is used as a connection electrode and the source/drain metal layer 157 is used as a horizontal sensing line, a problem of generation of a by-product is eliminated. Thus, since the use of the gate metal layer 155 and the source/drain metal layer 157 in forming the sensing line removes a factor causing generation of a by-product, a short between the data line and the sensing line may be improved and prevented.

The reason is because, the use of the light blocking layer 151 causes generation of a by-product according to the process of etching the buffer layer, but in the case of using such a process as in the third embodiment, since the light blocking layer 151 and the buffer layer 152 generating a by-product are not present, a probability of introduction of static electricity by the medium of a by-product is lowered.

As illustrated in FIGS. 27 and 28, in the second display panel, first to fourth subpixels SPn1 to SPn4 form a pixel, and an amount of the subpixels corresponding to resolution is formed.

A first power line EVDD is disposed on the left of the first subpixel SPn1 in a vertical direction. The first power line EVDD is commonly connected to the first subpixel SPn1 and the second subpixel SPn2. A first data line DLn1 and a second data line DLn2 are disposed between the first subpixel SPn1 and the second subpixel SPn2. The first data line DLn1 is connected to the first subpixel SPn1, and the second data line DLn2 is connected to the second subpixel SPn2.

A sensing line VREF is disposed on the left of the third subpixel SPn3 in a vertical direction. The sensing line VREF includes a vertical sensing line VREFM disposed in a vertical direction and a horizontal sensing line VREFS disposed in a horizontal direction. The sensing line VREF is commonly connected to the first subpixel SPn1 to fourth subpixel SPn4. A third data line DLn3 and a fourth data line DLn4 are disposed between the third subpixel SPn3 and the fourth subpixel SPn4. The third data line DLn3 is connected to the third subpixel SPn3, and the fourth data line DLn4 is connected to the fourth subpixel SPn4.

A scan line GL1 is disposed in a horizontal direction in a region of a sensing transistor ST included in each of the first subpixel SPn1 to fourth subpixel SPn4. The scan line GL1 is connected to gate electrodes of the sensing transistor ST and the switching transistor SW.

Results of configuring the experimental example using such a connection structure as that of (a) of FIG. 28 shows the presence of a short between the data line and the sensing line. In order to improve this problem, in manufacturing the second display panel, a structure of the connection electrode is changed on the basis of the first embodiment as illustrated in (b) of FIG. 28.

As described above through the first embodiment, the dummy semiconductor layer 153 is formed in the horizontal direction (direction intersecting with the data line) of the light blocking layer 153 corresponding to the connection electrode. The dummy semiconductor layer 153 is positioned in the overlap region (or overlap portion) between the light blocking layer 151 and the data line.

As in the first embodiment, when the dummy semiconductor layer 153 is formed on the region in which the light blocking layer 151 is formed, a short between the data line and the sensing line not solved by only the thickness of the second insulating layer 156 may be improved and prevented.

The reason is because a distance between the light blocking layer 151 as a connection electrode and the source/drain metal layer 157 is increased by the dummy semiconductor layer 153 and an interface of a tapered portion is improved. Also, since the distance between the light blocking layer 151 and the source/drain metal layer 157 is increased and the tapered portion is improved, a probability of introduction of static electricity by the medium of a by-product is lowered.

As described above, in the present disclosure, the problem of generation of a static electricity short, a short due to a by-product or a short due to a by-product and static electricity in the overlap portion between the heterogeneous lines is improved and prevented to resolve poor image quality such as a line defect generated in a specific line of a display surface. Also, in addition to the resolution of the poor image quality such as a defect generated in a specific line of the display surface, production yield may be enhanced.

What is claimed is:

1. An organic light emitting display device comprising:
   a first subpixel and a second subpixel disposed to be spaced apart from one another on a first substrate;
   a data line positioned between the first subpixel and the second subpixel and disposed in a vertical direction; and
   sensing lines having a vertical sensing line positioned on one side of the second subpixel and disposed in the vertical direction and a horizontal sensing line disposed in a horizontal direction intersecting with the data line, and connected to the vertical sensing line,
   wherein the horizontal sensing line is formed of a source/drain metal layer present on the first substrate, and one portion of the horizontal sensing line connected to a first electrode of a sensing transistor of the first subpixel and the other portion of the horizontal sensing line connected to a first electrode of a sensing transistor of the second subpixel are positioned in a region intersecting with the data line, and
   wherein the horizontal sensing line is electrically connected by a connection electrode formed of a light blocking layer below the source/drain metal layer present on the first substrate.

2. The organic light emitting display device of claim 1, wherein the light blocking layer, a buffer layer positioned on the light blocking layer, a dummy semiconductor layer positioned on the buffer layer, and an interlayer insulating layer positioned on the dummy semiconductor layer are provided between the first substrate and the source/drain metal layer.

3. The organic light emitting display device of claim 2, wherein:
   the source/drain metal layer positioned in a portion of the horizontal sensing line is connected to one side of the light blocking layer through a first contact hole formed in the interlayer insulating layer and the buffer layer,
   the source/drain metal layer positioned in the other portion of the horizontal sensing line is connected to the other side of the light blocking layer through a second contact hole formed in the interlayer insulating layer and the buffer layer, and
   the dummy semiconductor layer is positioned between the first contact hole and the second contact hole.

4. The organic light emitting display device of claim 3, wherein the connection electrode and the dummy semiconductor layer are branched into at least two lines.

5. An organic light emitting display device comprising:
   a first subpixel and a second subpixel disposed to be spaced apart from one another on a first substrate;
   a data line positioned between the first subpixel and the second subpixel and disposed in a vertical direction;
   sensing lines having a vertical sensing line positioned on one side of the second subpixel and disposed in the vertical direction, and a horizontal sensing line disposed in a horizontal direction intersecting with the data line and connected to the vertical sensing line, wherein the horizontal sensing line is formed of a source/drain metal layer present on the first substrate, and one portion of the horizontal sensing line connected to a first electrode of a sensing transistor of the first subpixel and the other portion of the horizontal sensing line connected to a first electrode of a sensing transistor of the second subpixel are positioned in a region intersecting with the data line, and wherein the horizontal sensing line is electrically connected by a connection electrode formed of a gate metal layer below the source/drain metal layer present on the first substrate.

6. The organic light emitting display device of claim 5, wherein a first insulating layer, the gate metal layer positioned on the first insulating layer, and a second insulating layer positioned on the gate metal layer are provided between the first substrate and the source/drain metal layer.

7. The organic light emitting display device of claim 6, wherein:

the source/drain metal layer positioned in one portion of the horizontal sensing line is connected to one side of the gate metal layer through a first contact hole formed in the second insulating layer, and the source/drain metal layer positioned in the other portion of the horizontal sensing line is connected to the other side of the gate metal layer through a second contact hole formed in the second insulating layer.

8. An organic light emitting display device comprising:

a first subpixel and a second subpixel disposed to be spaced apart from one another on a first substrate;

a data line positioned between the first subpixel and the second subpixel and disposed in a vertical direction;

sensing lines having a vertical sensing line positioned on one side of the second subpixel and disposed in the vertical direction, and a horizontal sensing line disposed in a horizontal direction intersecting with the data line and connected to the vertical sensing line, wherein the horizontal sensing line is formed of a pixel electrode present on the first substrate, and one portion of the horizontal sensing line connected to a first electrode of a sensing transistor of the first subpixel and the other portion of the horizontal sensing line connected to a first electrode of a sensing transistor of the second subpixel are positioned in a region intersecting with the data line, and wherein the horizontal sensing line is electrically connected by a connection electrode formed of a light blocking layer below a source/drain metal layer present on the first substrate.

9. The organic light emitting display device of claim 8, wherein the light blocking layer, a buffer layer positioned on the light blocking layer, an interlayer insulating layer positioned on the buffer layer, and a protective layer positioned on the interlayer insulating layer are provided between the first substrate and the pixel electrode.

10. The organic light emitting display device of claim 9, wherein:

the pixel electrode positioned in one portion of the horizontal sensing line is connected to one side of the light blocking layer through a first contact hole formed in the protective layer, the interlayer insulating layer, and the buffer layer, and the pixel electrode positioned in the other portion of the horizontal sensing line is connected to the other side of the light blocking layer through a second contact hole formed in the protective layer, the interlayer insulating layer, and the buffer layer.

11. A method for manufacturing an organic light emitting display device including a display panel having a first subpixel and a second subpixel disposed to be spaced apart from one another on a first substrate, a data line disposed in a vertical direction between the first subpixel and the second subpixel, and sensing lines having a vertical sensing line disposed on one side of the second subpixel in the vertical direction and a horizontal sensing line disposed in a horizontal direction intersecting with the data line, the method comprising:

forming a light blocking layer, a buffer layer, a semiconductor layer, and photoresist on the first substrate;

patterning the light blocking layer, the buffer layer, and the semiconductor layer using the photoresist to form a portion of the light blocking layer, as a connection electrode, and leave a portion of the semiconductor layer on the connection electrode to form a dummy semiconductor layer;

removing the photoresist and forming an interlayer insulating layer covering the light blocking layer, the connection electrode, the buffer layer, the semiconductor layer, and the dummy semiconductor layer on the first substrate;

forming a first contact hole in the interlayer insulating layer such that one side of the light blocking layer is exposed, and forming a second contact hole in the interlayer insulating layer such that the other side of the light blocking layer is exposed; and forming a source/drain metal layer on the interlayer insulating layer such that one portion of the source/drain metal layer is in contact with one side of the light blocking layer and the other portion of the source/drain metal layer is in contact with the other side of the light blocking layer to electrically connect the vertical sensing line and the horizontal sensing line.

12. The method of claim 11, wherein, in the forming of the dummy semiconductor layer, photoresist present in the first and second contact holes is patterned by a half-tone mask, and photoresist present in the dummy semiconductor layer part is patterned by a full-tone mask.

13. The method of claim 11, wherein the forming the light blocking layer, the buffer layer, the dummy semiconductor layer, and the interlayer insulating layer comprises providing the light blocking, buffer, dummy semiconductor, and interlayer insulating layers between the first substrate and the source/drain metal layer.

14. The method of claim 11, wherein the forming the source/drain metal layer further comprises:

connecting the source/drain metal layer positioned in a portion of the horizontal sensing line to one side of the light blocking layer through the first contact hole formed in the interlayer insulating layer and the buffer layer; and connecting the source/drain metal layer positioned in the other portion of the horizontal sensing line to the other side of the light blocking layer through the second contact hole formed in the interlayer insulating layer and the buffer layer, wherein the dummy semiconductor layer is positioned between the first contact hole and the second contact hole.

15. The method of claim 11, wherein the forming the connection electrode comprises branching the connection electrode and the dummy semiconductor layer into at least two lines.

\* \* \* \* \*